(12) United States Patent
Damadian

(10) Patent No.: US 7,196,519 B2
(45) Date of Patent: Mar. 27, 2007

(54) STAND-UP VERTICAL FIELD MRI APPARATUS

(75) Inventor: Raymond V. Damadian, Woodbury, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 10/999,667

(22) Filed: Nov. 30, 2004

(65) Prior Publication Data

US 2005/0248347 A1    Nov. 10, 2005

Related U.S. Application Data

(63) Continuation-in-part of application No. 09/918,369, filed on Jul. 30, 2001, which is a continuation-in-part of application No. 09/718,946, filed on Nov. 22, 2000, now Pat. No. 6,677,753.

(60) Provisional application No. 60/526,029, filed on Dec. 1, 2003, provisional application No. 60/252,837, filed on Nov. 22, 2000, provisional application No. 60/222,098, filed on Jul. 28, 2000.

(51) Int. Cl.
G01V 3/00    (2006.01)

(52) U.S. Cl. ..................... 324/318; 324/309

(58) Field of Classification Search ............ 324/318, 324/319, 322, 309, 307, 300; 335/296, 299; 600/410
See application file for complete search history.

(56) References Cited

U.S. PATENT DOCUMENTS

| | | |
|---|---|---|
| 4,105,923 A | 8/1978 | Hynes, Jr. |
| 4,534,076 A | 8/1985 | Barge |
| 4,534,358 A | 8/1985 | Young |
| 4,567,894 A | 2/1986 | Bergman |
| 4,608,991 A | 9/1986 | Rollwitz |
| 4,613,820 A | 9/1986 | Edelstein et al. |
| 4,629,989 A | 12/1986 | Riehl et al. |
| 4,651,099 A | 3/1987 | Vinegar et al. |
| 4,668,915 A | 5/1987 | Daubin et al. |
| 4,707,663 A | 11/1987 | Minkoff et al. |
| 4,727,328 A | 2/1988 | Carper et al. |
| 4,766,378 A | 8/1988 | Danby et al. |
| 4,777,464 A | 10/1988 | Takabatashi |
| 4,829,252 A | 5/1989 | Kaufman |
| 4,875,485 A | 10/1989 | Matsutani |
| 4,908,844 A | 3/1990 | Hasegawa |
| 4,924,198 A | 5/1990 | Laskaris |
| 4,968,937 A | 11/1990 | Akgun |

(Continued)

FOREIGN PATENT DOCUMENTS

JP    1-242056    9/1989

(Continued)

*Primary Examiner*—Brij B. Shrivastav
(74) *Attorney, Agent, or Firm*—Lerner, David, Littenberg, Krumholz & Mentlik, LLP

(57) ABSTRACT

Apparatus and method for magnetic resonance imaging. In an aspect, the present invention is an apparatus for magnetic resonance imaging that includes a short bore magnet that is oriented such that, when energized, a static magnetic field is created in a substantially vertical direction. In another aspect, the present invention is a method for performing magnetic resonance imaging using a short bore magnet that is oriented such that, when energized, a static magnetic field is created in a substantially vertical direction.

38 Claims, 8 Drawing Sheets

U.S. PATENT DOCUMENTS

| | | |
|---|---|---|
| 4,985,678 A | 1/1991 | Gangarosa et al. |
| 5,008,624 A | 4/1991 | Yoshida |
| 5,061,897 A | 10/1991 | Danby et al. |
| 5,065,761 A | 11/1991 | Pell |
| 5,124,651 A | 6/1992 | Danby et al. |
| 5,150,710 A | 9/1992 | Hall et al. |
| 5,153,546 A | 10/1992 | Laskaris |
| 5,155,758 A | 10/1992 | Vogl |
| 5,162,768 A | 11/1992 | McDougall et al. |
| 5,194,810 A | 3/1993 | Breneman et al. |
| 5,197,474 A | 3/1993 | Englund et al. |
| 5,207,224 A | 5/1993 | Dickinson et al. |
| 5,210,893 A | 5/1993 | Uosaki et al. |
| 5,229,723 A | 7/1993 | Sakurai et al. |
| 5,250,901 A | 10/1993 | Kaufman et al. |
| 5,259,011 A | 11/1993 | Petro |
| 5,291,890 A | 3/1994 | Cline et al. |
| 5,305,365 A | 4/1994 | Coe |
| 5,305,749 A | 4/1994 | Li et al. |
| 5,315,276 A | 5/1994 | Huson et al. |
| 5,349,956 A | 9/1994 | Bonutti |
| 5,382,904 A | 1/1995 | Pissanetzky |
| 5,386,447 A | 1/1995 | Siczek |
| 5,412,363 A | 5/1995 | Breneman et al. |
| 5,436,607 A | 7/1995 | Chari et al. |
| 5,475,885 A | 12/1995 | Ishikawa |
| 5,490,513 A | 2/1996 | Damadian et al. |
| 5,519,372 A | 5/1996 | Palkovich et al. |
| 5,592,090 A | 1/1997 | Pissanetzky |
| 5,606,970 A | 3/1997 | Damadian |
| 5,623,241 A | 4/1997 | Minkoff |
| 5,624,159 A | 4/1997 | Celoni et al. |
| 5,640,958 A | 6/1997 | Bonutti |
| 5,659,281 A * | 8/1997 | Pissanetzky et al. ........ 335/296 |
| 5,680,861 A | 10/1997 | Rohling |
| 5,689,190 A * | 11/1997 | Cuppen ..................... 324/319 |
| 5,735,278 A | 4/1998 | Hoult et al. |
| 5,743,264 A | 4/1998 | Bonutti |
| 5,779,637 A | 7/1998 | Palkovich et al. |
| 5,825,843 A * | 10/1998 | Kobayashi ................... 378/20 |
| 5,983,424 A | 11/1999 | Naslund |
| 6,003,174 A | 12/1999 | Kantrowitz et al. |
| 6,014,070 A | 1/2000 | Danby et al. |
| 6,023,165 A * | 2/2000 | Damadian et al. .......... 324/318 |
| 6,094,760 A | 8/2000 | Nonaka et al. |
| 6,198,957 B1 | 3/2001 | Green |
| 6,246,239 B1 | 6/2001 | Krogmann et al. |
| 6,249,695 B1 | 6/2001 | Damadian |
| 6,335,623 B1 | 1/2002 | Damadian et al. |
| 6,375,147 B1 * | 4/2002 | Radziun et al. ............. 248/638 |
| 6,411,088 B1 | 6/2002 | Kuth et al. |
| 6,414,490 B1 | 7/2002 | Damadian et al. |
| 6,433,550 B1 * | 8/2002 | Kinanen .................... 324/320 |
| 6,534,982 B1 | 3/2003 | Jakab |
| 6,774,633 B2 * | 8/2004 | Wang et al. ................ 324/318 |
| 6,806,712 B2 * | 10/2004 | Akgun ...................... 324/318 |
| 6,879,157 B1 * | 4/2005 | Bonanni et al. ............ 324/309 |
| 2004/0024434 A1 * | 2/2004 | Yang et al. .................. 607/96 |
| 2005/0285595 A1 * | 12/2005 | Green et al. ................ 324/307 |

FOREIGN PATENT DOCUMENTS

| | | |
|---|---|---|
| WO | WO-97/17896 | 5/1997 |

* cited by examiner

STAND-UP VERTICAL FIELD MRI APPARATUS

CROSS-REFERENCE TO RELATED APPLICATIONS

This application is a continuation-in-part of U.S. patent application Ser. No. 09/918,369 filed Jul. 30, 2001 which is a continuation-in-part of U.S. patent application Ser. No. 09/718,946 filed Nov. 22, 2000 now U.S. Pat. No. 6,677,753 and which claims the benefit of the filing dates of Provisional Patent Application Nos. 60/252,837 filed Nov. 22, 2000 and 60/222,098 filed Jul. 28, 2000, the disclosures of which are hereby incorporated herein by reference. This application also claims the benefit of the filing date of U.S. Provisional Patent Application No. 60/526,029 filed Dec. 1, 2003, the disclosure of which is hereby incorporated herein by reference.

BACKGROUND OF THE INVENTION

The present invention relates to magnetic resonance imaging systems, apparatus and procedures.

In magnetic resonance imaging, an object to be imaged as, for example, a body of a human subject, is exposed to a strong, substantially constant static magnetic field. The static magnetic field causes the spin vectors of certain atomic nuclei within the body to randomly rotate or "precess" around an axis parallel to the direction of the static magnetic field. Radio frequency excitation energy is applied to the body, and this energy causes the nuclei to rotate or "precess" in phase and in an excited state. As the precessing atomic nuclei relax, weak radio frequency signals are emitted; such radio frequency signals are referred to herein as magnetic resonance signals.

Different tissues produce different signal characteristics. Relaxation times are the dominant factor in determining signal strength. In addition, tissues having a high density of certain nuclei will produce stronger signals than tissues with a low density of such nuclei. Relatively small gradients in the magnetic field are superimposed on the static magnetic field at various times during the process so that magnetic resonance signals from different portions of the patient's body differ in phase and/or frequency. If the process is repeated numerous times using different combinations of gradients, the signals from the various repetitions together provide enough information to form a map of signal characteristics versus location within the body. Such a map can be reconstructed by conventional techniques well known in the magnetic resonance imaging art, and can be displayed as a pictorial image of the tissues as known in the art.

The magnetic resonance imaging technique offers numerous advantages over other imaging techniques. MRI does not expose either the patient or medical personnel to X-rays and offers important safety advantages. Also, magnetic resonance imaging can obtain images of soft tissues and other features within the body which are not readily visualized using other imaging techniques. Accordingly, magnetic resonance imaging has been widely adopted in the medical and allied arts.

Many conventional magnetic resonance imaging instruments require that a patient lie on a horizontal bed that is then advanced into a tubular bore within a super-conducting solenoidal magnet used to generate the static magnetic field. Other conventional MRI imaging instruments use a magnet having a ferromagnetic frame defining a patient-receiving space. Considerable effort has been devoted to the design of such magnets in a manner that provides a relatively open patient-receiving space as opposed to the claustrophobic tubular bore of the conventional solenoidal magnet. However, in these instruments as well, the common practice is to provide the patient on a bed that remains horizontal throughout the procedure.

The position of a patient during magnetic resonance imaging may affect or limit the imaging information obtained. A patient may exhibit a symptom if oriented in an upright or weight bearing position and no symptom if oriented in a recumbent or horizontal position. For example, it may be necessary to image a patient in an upright or gravity bearing position to discern a symptom and provide a diagnosis for injuries relating to the neck, spine, hip, knee, foot or ankle areas of the human anatomy.

Advancement in magnetic resonance imaging has resulted in imaging apparatus that supports a patient in any position between a vertical position and a horizontal position. As described in greater detail in certain embodiments of commonly assigned U.S. Pat. Nos. 6,414,490 and 6,677,753, the disclosures of which are hereby incorporated by reference herein, a magnetic resonance imaging system can be provided with a patient support, such as a table, which can extend in a generally vertical direction so that the long axis of the patient is substantially vertical. For example, the patient may be in a standing posture, with his back, side or front leaning against a generally vertical patient support. Such a support may include a footrest projecting from the table at its lower end and the patient may stand on the footrest. In other arrangements, the support includes a seat projecting from the table so that the seat is in a horizontal plane when the table surface is vertical. In particularly preferred arrangements, the patient support can move relative to the magnet. For example, the patient support may be arranged to move vertically relative to the magnet so as to elevate a portion of the patient into the patient-receiving space of the magnet. Alternatively or additionally, the patient support may be arranged to tilt through a range of orientations between a generally horizontal orientation and a generally vertical orientation.

The magnets used in the preferred embodiments of the aforementioned '490 and '753 patents typically are arranged so that the magnetic field is directed along a horizontal axis, transverse to the axis of elongation of the patient support and hence transverse to the long axis of the patient. By contrast, in a conventional solenoidal magnet where the patient is received inside the bore of the solenoid, the magnetic field is directed along the long axis of the patient. U.S. Pat. No. 5,349,956, shows a theoretical proposal for a conventional solenoidal magnet having its axis orientated in a vertical direction, with a patient elevator arranged to raise a standing patient into the bore. In theory, such an arrangement could provide for imaging of a patient in an upright position. In practice, this arrangement is never used. One aspect of the present invention incorporates the realization that there are mechanical and safety difficulties inherent in this approach, together with problems presented by a terrifying and claustrophobic environment for the patient.

SUMMARY OF THE INVENTION

An aspect the present invention provides a magnetic resonance imaging apparatus comprising a magnet having a bore preferably extending along a substantially vertical axis and a patient support device positioned relative to the magnet bore such that the patient support device may be translated in a direction substantially parallel to the vertical axis to occupy the magnet bore. Preferably, the length of the magnet along a direction parallel to the vertical axis is less than approximately four feet.

In accordance with this aspect of the present invention, it is desirable that the apparatus also include a building structure housing said magnet and a magnet support structure connected to the building structure and connected to the magnet.

Further in accordance with this aspect of the present invention, the building structure includes a floor and the magnet support is connected to the floor.

Further in accordance with this aspect of the present invention, the apparatus includes a support structure having one end connected to a ceiling and another end connected to the magnet.

Preferably, the magnet has an inner bore diameter of approximately three feet or more, however, an inner bore diameter of approximately eighteen inches or more is also suitable.

In a preferred embodiment in accordance with this aspect of the invention, the magnet comprises a solenoidal magnet having turns encircling the bore and adapted to generate a static magnetic field having a field direction coaxial with said bore.

In addition, it is desirable that the patient support be mounted to an elevator and it is further desirable that the elevator be disposed beneath the floor.

Further in accordance with this aspect of the present invention, the magnet is disposed in a well which is most preferably disposed approximately three feet beneath floor level, so that the magnet is disposed partially or entirely beneath the level of the floor.

It may also be preferable to provide a support structure having one end connected to a floor and another end connected to the magnet and wherein the patient support device is mounted on an elevator. Most preferably the elevator is disposed in a well in the floor. It may be further desirable to have the well disposed approximately three feet below floor level.

Further in accordance with this aspect of the present invention, the magnet preferably has an inner bore diameter of approximately three feet or less.

In another embodiment the magnet and patient support are rotatable between a substantially upright position substantially parallel to the vertical axis and a substantially recumbent position substantially transverse to the vertical axis. It also desirable that the magnet and patient support be positionable in either the Trendelberg or reverse Trendelburg positions.

Another aspect of the present invention is a magnet having a bore extending along a substantially vertical axis. The magnet is preferably disposed in a well beneath a floor. The apparatus further desirably includes a patient support device positioned relative to the magnet bore such that the patient support device may be translated in a direction substantially parallel to the vertical axis within the magnet bore.

In accordance with this latter aspect, the patient support device may be mounted to an elevator. Preferably, the magnet has an inner bore diameter of approximately three feet.

In a preferred embodiment in accordance with this latter aspect, the magnet has an inner bore diameter of at least approximately two feet.

Further in accordance with this aspect of the present invention, the length of the magnet along a direction parallel to the vertical axis is less than approximately three feet and, most preferably, less than approximately two feet.

In a method aspect in accordance with the present invention, a method comprises providing a magnet having a bore extending along a substantially vertical axis and providing a patient support device positioned relative to the magnet bore such that the patient support device may be translated in a direction substantially parallel to the vertical axis. Further in accordance with the method, a patient is positioned on the patient support such that a portion of the patient's anatomy occupies the space within the magnet bore.

It is yet a further aspect of the present invention to provide a method for magnetic resonance imaging comprising providing a magnet having a bore extending three feet or less along a substantially vertical axis; and positioning a patient in a sitting position adjacent the magnet such that the patient's feet hang in the bore.

Another aspect of the present invention comprises a facility for magnetic resonance imaging including a first magnet having a bore extending along a substantially vertical axis, said first magnet having a length along a direction parallel to the vertical axis less than approximately four feet and a second magnet having a bore extending along a substantially horizontal axis, said second magnet having a length along a direction parallel to the horizontal axis less than approximately four feet.

An additional variant in accordance with the present invention includes the use of a superconducting magnet having a longitudinal thickness of approximately 7 centimeters turned on its end to provide a static magnetic field directed substantially in a vertical direction, thereby allowing a standing patient to be imaged within the bore of the magnet assembly. Another variant includes vertically stacking two or more pancake magnets to provide an open magnetic resonance imaging apparatus.

Another variant includes stacking two superconducting magnet assemblies together such that a static magnetic field is directed substantially in a vertical direction, thereby allowing a standing patient to be imaged within the bore of the magnet assembly.

An additional aspect of the present invention is a magnetic resonance imaging apparatus preferably comprising a magnet having a patient-receiving space and a static magnetic field axis in a substantially vertical direction. The apparatus may further desirably comprise a patient support device positionable in the patient-receiving space such that a long axis of a patient supported by the patient support is substantially parallel to the direction of the static magnetic field axis.

Further in accordance with this aspect of the present invention, the magnet preferably includes a bore extending in a direction substantially parallel to the static magnetic field axis. Preferably, the length of the magnet along the direction of the bore is less than approximately three feet.

Further in accordance with the aspect of the present invention the magnet preferably comprises a separated pair of annular elements. The annular elements are preferably connected by members having a long axis parallel to the static magnetic field axis so as to define the space separating the annular elements.

DETAILED DESCRIPTION

Figure 1:
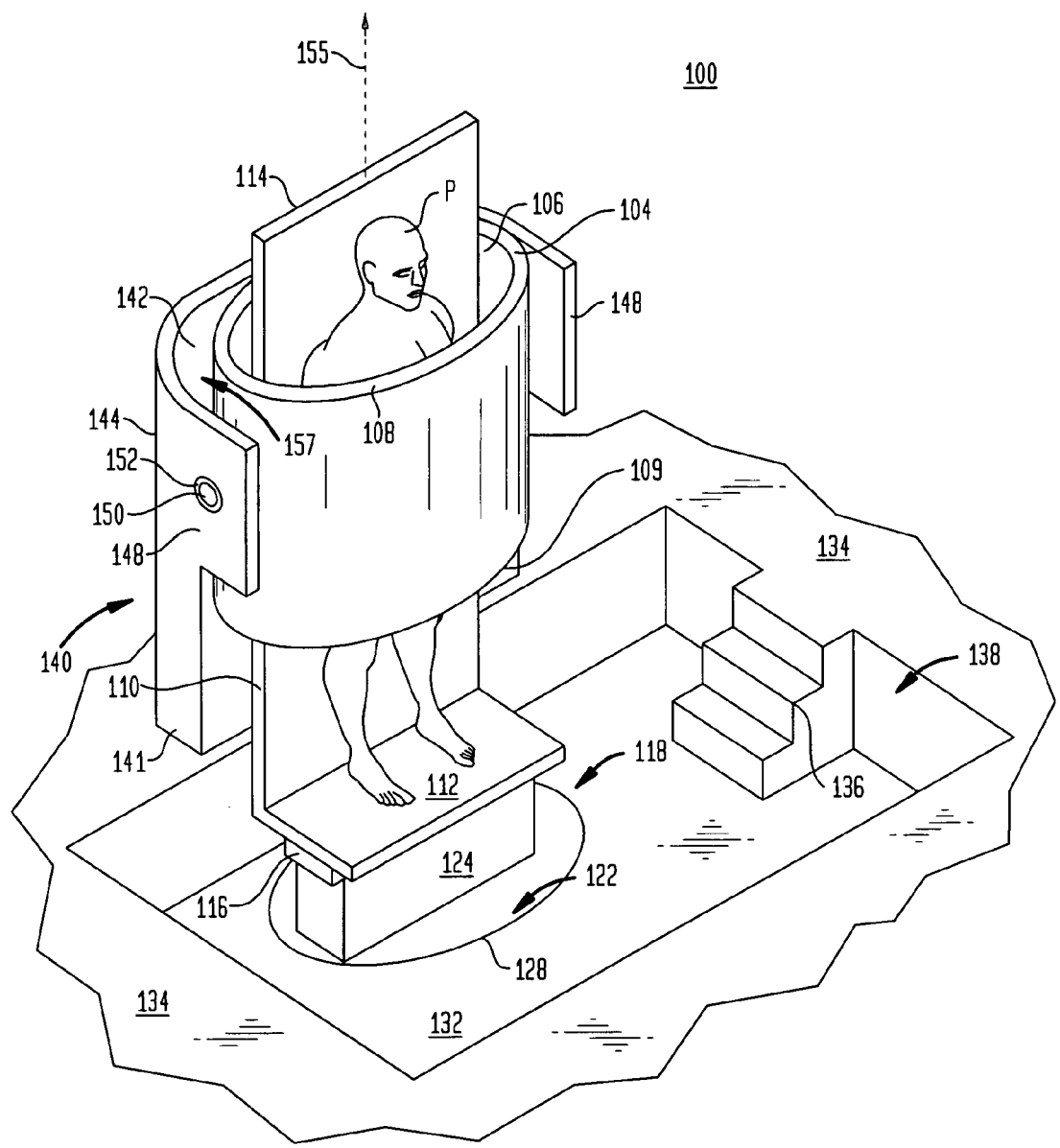
FIG. 1 is a perspective view of a magnetic resonance imaging apparatus in accordance with an aspect of the present invention.

FIG. 1 is a perspective view of a magnetic resonance imaging apparatus 100 in accordance with an aspect of the present invention. The apparatus 100 includes a magnet 104 having a substantially cylindrical central bore 106. The magnet 104 is preferably an electromagnet and most preferably a superconducting solenoidal magnet. A patient support device or table 110 is positionable within the bore 106 and, as shown, may protrude through each end 108, 109 of the magnet 104. As illustrated, the patient support device 110 is capable of supporting a patient P in a standing position with the patient's head and feet being positioned outside the bore. The patient support device 110 may also be constructed so as to support a patient in a seated or sitting position. The patient support device 110 includes a footrest 112 at one end, which provides a standing surface for a patient. The patient support includes a distal or free end 114 opposite the footrest 112. When a patient is oriented in a standing position, the patient's head is located towards the free end 114. The patient support may also include a seat (not shown) that allows a patient to sit while imaged. The patient support device may be made in accordance with the patient support device disclosed in pending U.S. patent application Ser. No. 10/131,843, filed on Apr. 25, 2002; Ser. No. 10/427,443 filed on Oct. 6, 2003; and Ser. No. 09/918,369, filed on Jul. 30, 2001, which are assigned to assignee of the present invention, the disclosures of which are incorporated by reference herein in their entirety.

As further illustrated in FIG. 1, the footrest 112 of the patient support device 110 is preferably attached or mounted on a pedestal 116 of an elevator 118. The elevator 118 is disposed within a well 122. The elevator 118 includes a shaft member 124. The shaft member 124 may comprise a plurality of co-centric cylindrical shaped members that recess into one another and an opening 128, e.g., telescoping. Alternatively, the shaft member may comprise a plurality of rectangular or square shaped members that recess into one another and into the opening 128. Although other arrangements for an elevator may be used, the use of shaft members wherein the rectangular or cylindrical shaped members recess into each other aids in minimizing the vertical space required beneath the well floor 132. Preferably, the opening 128 for the shaft member 124 extends approximately two feet beneath the floor 132 of the well 122. Access to the patient support device 110 is provided by a series of steps 134 to an open area, well or pit 138. In a preferred embodiment, the floor 132 of the area 138 is at a depth of approximately 3 feet beneath the floor 134.

The apparatus also includes a support structure 140 for the magnet 104. As shown, the support structure 140 includes one end 141 proximate the floor 134. The support structure 140 also includes an inner sidewall 142 and an outer sidewall 144. The inner and outer sidewalls 142, 144 are curved to accept the shape of the magnet. The inner and outer sidewalls, 142, 144 terminate on L-shaped end walls 148, 148, which are arranged substantially opposite each other. Most preferably, each end wall 148 includes an opening through which is inserted a rod member 150. As shown, an end of the rod member 150 includes a flange 152 the overlaps the end wall 148 opening so as to keep the rod member 150 in place. The other end (not shown) of the rod member 150 is connected to the magnet 104. The arrangement of the rod member 150 allows the magnet 104 to tilt relative to a vertical axis 155. Accordingly, the apparatus preferably includes a space 157 between the inner sidewall 142 and the rearward outer wall of the magnet 104.

In addition to acting as a support for the magnet 104, the support structure 140 also serves as a housing through which the power supply and cooling flow necessary to operate a magnet may be fed to the magnet 104. Accordingly, the inner sidewall 142 may also include an opening through which cables and other conduits may be attached to the magnet 104. Where the magnet 104 is a superconducting magnet, a main magnet coil and a correction magnet coil may be wound within the interior of magnet structure 104. A cryocooler or other suitable cooling agent passes through conduits in the support structure 140 to cool both the main and correction magnet coils. In addition, suitable electrical connections may also be provided via the support structure to energize both the main coil and the correction coil and to provide a signal for controlling the tilt of the magnet 104.

The distance between the lower end 109 and the floor 134 is chosen so as to allow enough clearance space between the free end 114 of the patient support device 110 and the lower end 109 of the magnet 104 so that a patient can step onto the foot rest 112 when the elevator 118 is at its lowest point without hitting their head against the lower end 109. Thus, preferably the distance between the well floor 132 and the lower end 109 is at least six feet. Most preferably, the lower end 109 of the magnet 104 is suspended approximately three feet above the floor 134 and six feet above the well floor 132. In such an arrangement, the length of the patient support 110, as measured between the footrest 112 and the free end 114, is slightly less than six feet so that the patient support sits entirely beneath the lower end 109 of the magnet when the elevator 118 is completely recessed within the opening 128.

The distance between the lower end 109 of the magnet and the floor 134 or the distance between the floor 132 and the floor 134 (i.e., the well or pit depth) may be suitably arranged to allow for more room between the lower end 109 of the magnet and the free end 114 of the patient support. For example, the lower end 109 of the magnet may be positioned approximately four feet above the floor 134 with a bit depth of three feet. Alternatively, the lower end 109 of the magnet may be positioned approximately three feet above the floor 134 with a "pit" depth of four feet.

In accordance with another aspect of the present invention, a patient can be imaged as follows. Initially, the elevator 118 is adjusted to its lowest position such that the planar surface of the footrest 112 is substantially parallel with the well floor 132. A patient P enters the well or pit area 138 using steps 136 and proceeds to stand on the footrest 112. The elevator 118 is then raised and the patient enters the bore 106 headfirst. An operator then adjusts the height of the elevator 118 such that that portion of the patient's anatomy to be imaged will be appropriately positioned within the imaging volume of the magnet 104. Preferably, the coils of the magnet would have been previously energized (e.g., at the start of the day) to create a static magnetic field that is oriented substantially vertically and in a direction substantially parallel to the vertical axis 155, which is substantially parallel to the long axis of the patient. Imaging then proceeds as is known in the art. Once imaging is completed the elevator is lowered so that the planar surface of the footrest 112 is again substantially parallel with the well floor 132. The patient may then step off footrest 112 and exit the pit or well area 138.

As previously discussed, the magnet 104 may include a mechanism that allows the magnet to tilt relative to the vertical axis 155. Thus, in some instances the imaging process may also include tilting the magnet and acquiring images of the patient with the magnet at an angle relative the patient.

Figure 2A:
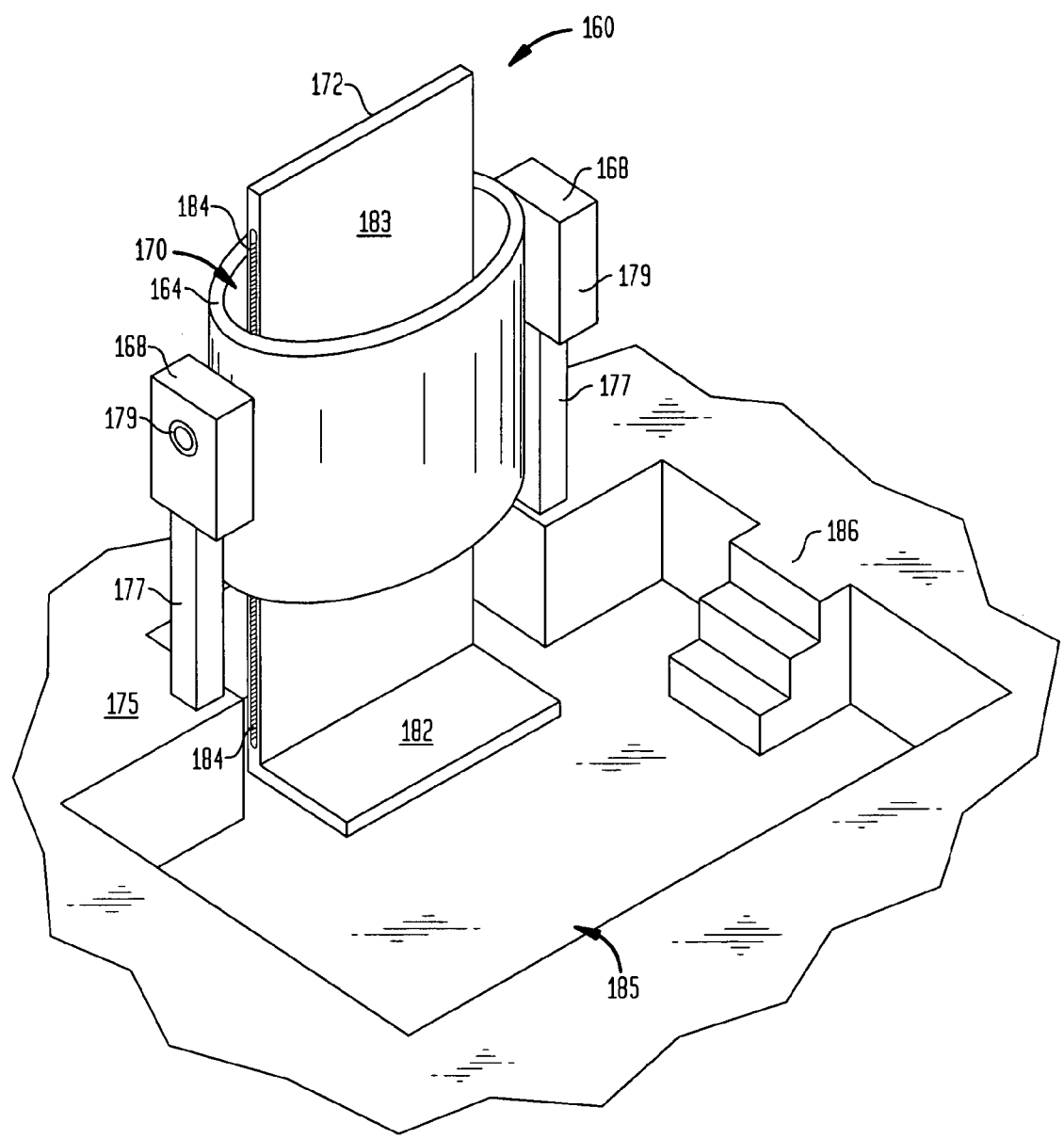
FIG. 2A is a perspective view of a magnet resonance imaging apparatus in accordance with an aspect of the present invention.

FIG. 2A illustratively depicts a perspective view of a short bore magnet apparatus 160 in accordance with an aspect of the present invention. The apparatus 160 includes a short bore magnet 164 and a support structure 168. The magnet 164 is most preferably a superconducting solenoidal magnet and includes a bore 170. A patient support device 172 is supported by support structures 168, 168 and positionable within the bore 170. In addition to providing support to the magnet 164 and device 172, the support structure 178 also provides a housing and conduits for supporting power and cooling necessary to operate the magnet 164. Thus, wiring and piping may enter the support structure through the floor 175 at legs 177, 177 and be fed to the magnet 164 through the box 179 of the housing 168.

The device 172 includes a footrest 182 for supporting the feet of a standing patient and a support surface 183 against which either the anterior or posterior surface of a patient's anatomy may be supported. The device 172 also includes a pair of slots 184 along its longitudinal edges 186. The slots 184 are used to translate the device into and out of the bore 170 of the magnet 164. As seen in FIG. 2A, the device 172 is disposed above a well 185, which may be entered by steps 186.

In operation, a patient enters the well 185 via steps 186 while the device 172 is lowered to the floor 187 of the well 185. Once the patient is positioned on the footrest 182, the device 172 is raised, via gears housed in box 179, so that that portion of the patient's anatomy of interest may be imaged.

Figure 2B:
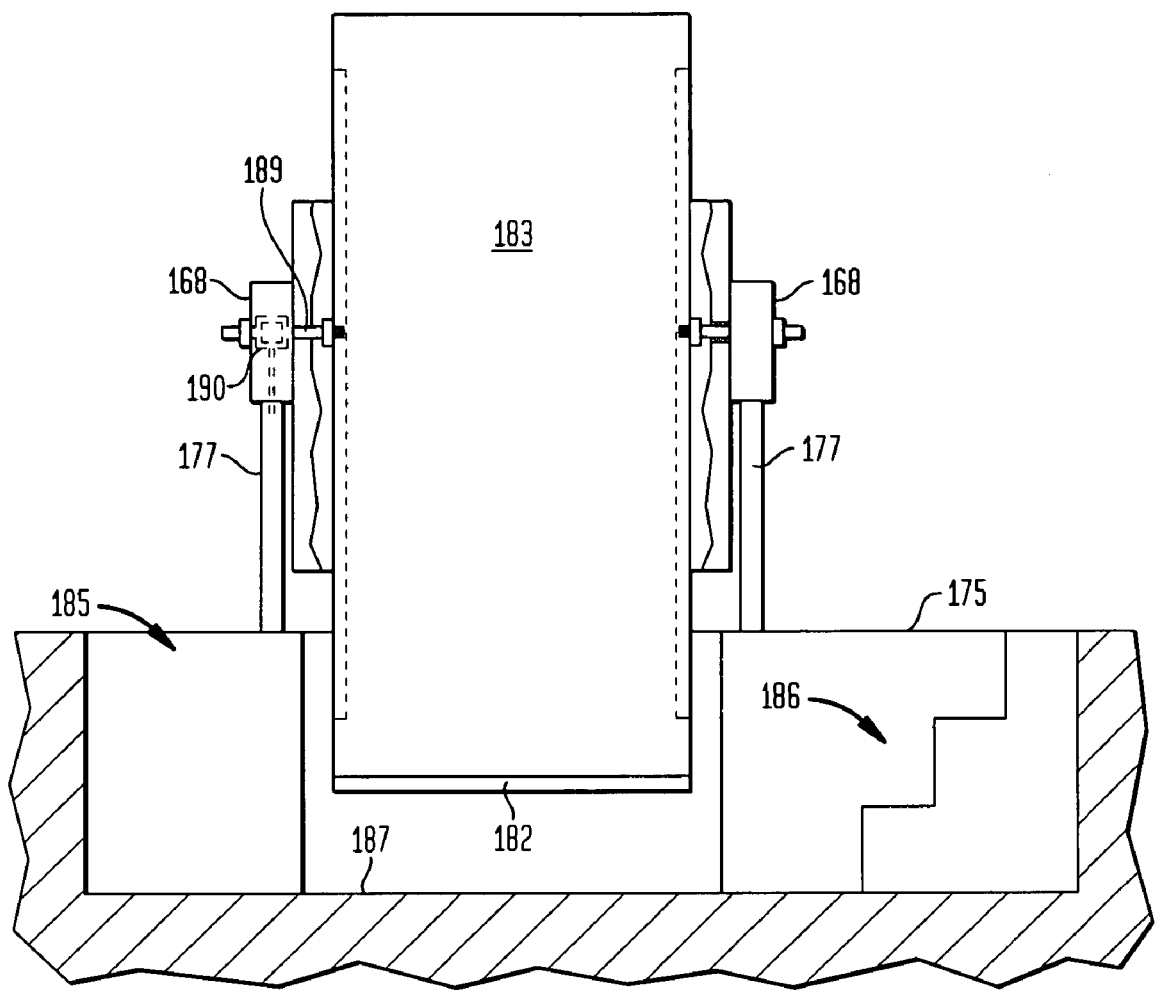
FIG. 2B is a front view of the magnet apparatus of FIG. 2A.

In addition to allowing for imaging in an upright position, the apparatus 160 allows the patient to be also imaged in any position between horizontal and vertical, and the Trendelburg and reverse Trendelburg positions by rotating the magnet 164 and device 172. As best seen in FIG. 2B, the magnet 164 and device 172 are rotatably mounted to the support structure 168. In a preferred embodiment, a rod member 189 is mounted to gears 190, the device 172 and the magnet 174.

Figure 2C:
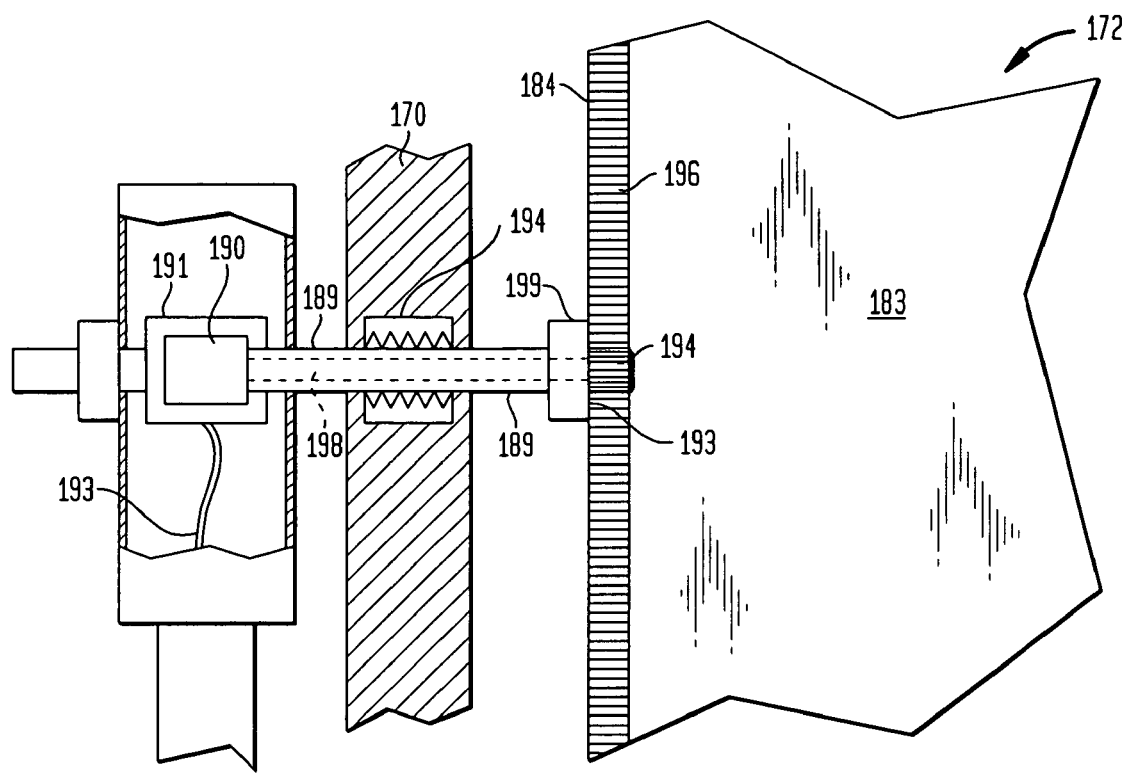
FIG. 2C is a partial exploded view of a portion of the magnet apparatus of FIG. 2A.

As best seen in FIG. 2C, the rod member 189 and gear 190 are coupled together in block 191 and are preferably electrically controlled and operated via cables 192, which extend downward to the floor. In the magnet 170, the rod member 189 is mounted into a sleeve 194 that rotates in unison with the rod 189. The rod member 189 terminates on the longitudinal edge of the device 172 in the slots 184. As shown, the end portion 193 of the rod member 189 disposed within slot 184 may include a larger cylindrical diameter than the rest of the rod, so that grooves 194 formed on the end portion 193 may reliably support, rotate and translate the device 172.

Figure 2D:
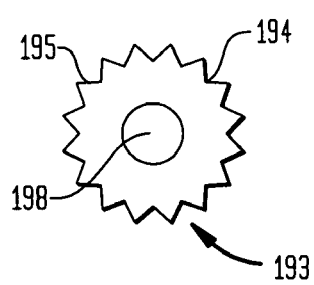
FIG. 2D illustratively depicts an embodiment of a portion of a rod member in accordance with an aspect of the present invention.

As best seen in FIG. 2D, the grooves 194 form pawls or fingers 195 that engage slots 196 on the device 172. In the embodiment shown, translation of the device 172 relative to the bore 170 of the magnet 168 occurs when inner rod 198 (see FIG. 2D), which may form a unitary structure with end portion 193, rotates within the rod member 189. Thus, where rotation of the magnet 168 and device 172 is desired, the inner rod 198 remains fixed relative to rod member 189 and the device 172 rotates via rod member 189 at end cap 199.

Although in the embodiment shown in FIG. 2, the rotation of the magnet and device and translation of device are discussed in relation to one of the support structure 168, the same or similar rotational and translation means may be incorporated on the other support structure 168. Thus, in a variant the mechanism for rotation and translation may be implemented on either support structure or both support structures. In some instances it may be preferable to have the rotational and translation means included only in a single support structure, while using the other support to provide any other ancillary functions, e.g., cable and conduit routing, necessary to operate the apparatus. In addition to the particular rotation and translation disclosures discussed above, other structures known in the art for similar functionality may be provided accordingly.

Figure 3:
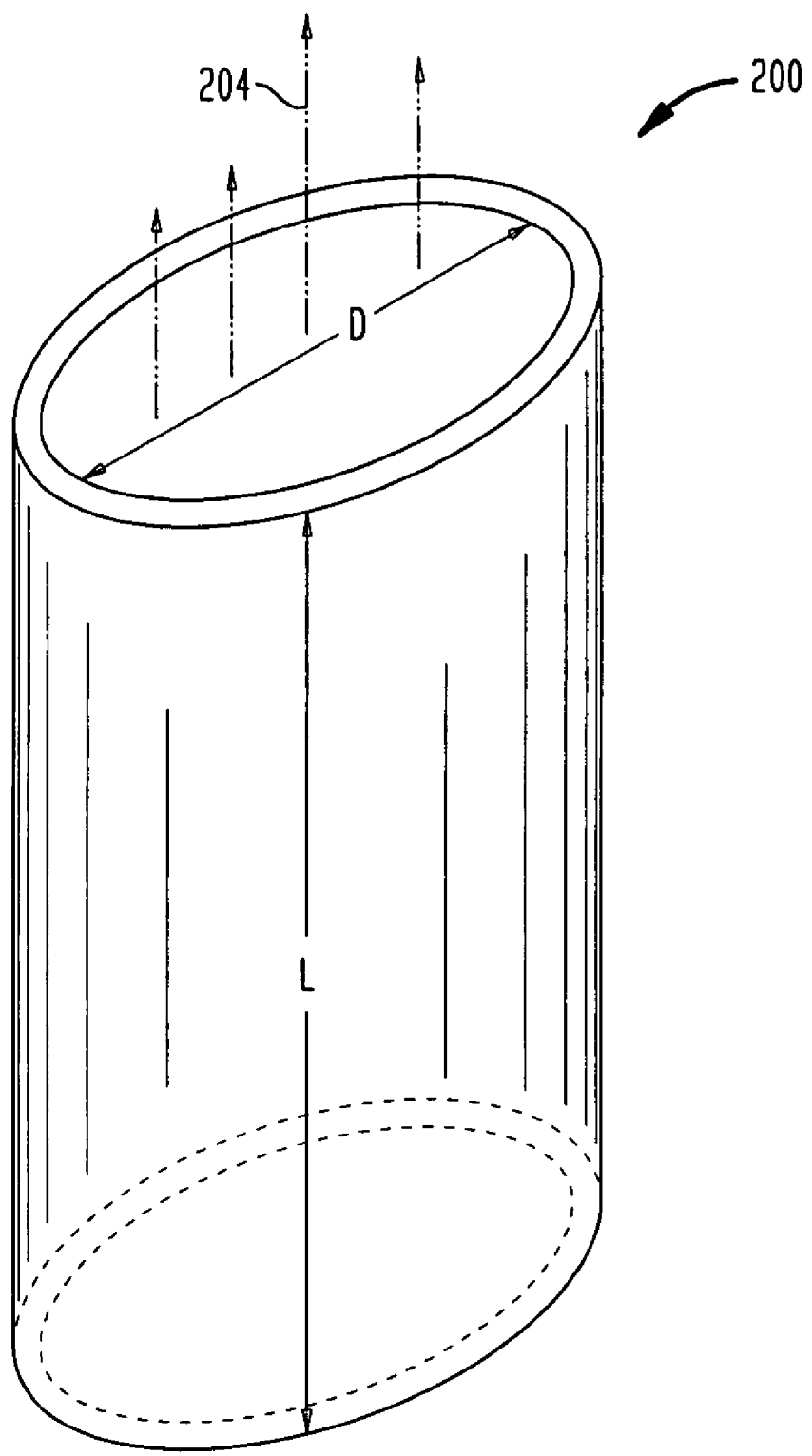
FIG. 3 is a perspective view of a short bore magnet in accordance with an aspect of the present invention.

As best seen in FIG. 3, in a preferred embodiment a magnet 200 in accordance with the present invention includes a central cylindrical bore having a diameter, D, of approximately eighteen inches or more. In addition, the length of the magnet, L, as measured along a cylindrical axis 204 is preferably approximately three feet. The diameter D of the magnet impacts the field strength and homogeneity of the static magnetic field that is produced when the magnet coils are energized. Thus, as the internal diameter D is increased, the strength and homogeneity of the magnetic field within the bore may be affected. However, the diameter D of the magnet 200 may be as large as three feet or more without sacrificing too much in the way of image acquisition by increasing the number of ampere-turns if necessary.

As discussed above, the well depth and distance between the lower end 109 of the magnet and floor 134 is advantageously chosen to provide a comfortable clearance space between the lower end 109 of the magnet as the patient steps onto and off the foot rest 112. Thus, in a preferred embodiment well 122 is approximately three feet in depth and the magnet 104 is positioned such that its lower end 109 is approximately three feet above the floor. With a magnet having a length, L, of three feet, an apparatus, in accordance with the present invention, may require a floor 134 to ceiling clearance of approximately nine feet for full body scanning. The floor 134 to ceiling clearance space requirement may be suitably lowered by increasing the well depth so that the apparatus may be housed in facilities that include less than nine feet of ceiling clearance space.

Figure 4:
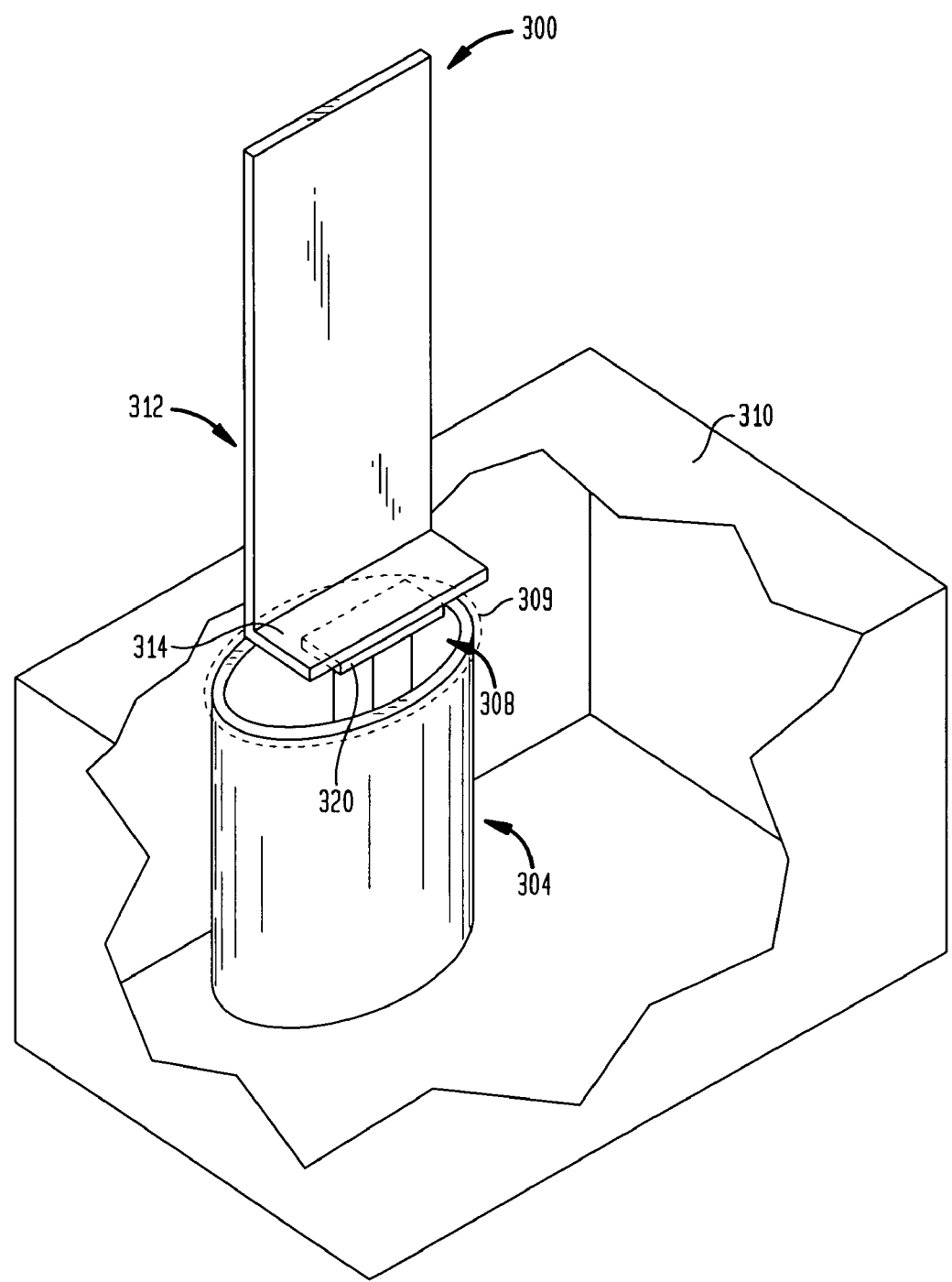
FIG. 4 is a perspective view of a magnetic resonance imaging apparatus in accordance with an aspect of the present invention.

FIG. 4 illustrates a magnetic resonance imaging apparatus 300 in accordance with an aspect of the present invention. The apparatus includes a magnet 304 preferably having a substantially cylindrical center bore 308, which is disposed in an opening 309 beneath a floor 310. The magnet 304 may be of the type discussed above in reference to FIGS. 1, 2 and 3. A patient support member 312 having a base member 314 and a wall 316 substantially transverse to the base member 314 is disposed in the bore 308. The patient support member 312 may be used as standing area for a patient. The patient support member 312 is mounted on an elevator 320. The elevator is used to lower and raise the patient support member 312 within the bore 308. As discussed, the apparatus 300 is preferably disposed beneath the floor 310. Preferably, the opening 310 for the magnet is contoured such that it completely hides the magnet 304. In accordance with an aspect of the present invention, a patient may sit on the floor 310 with his or her leg hanging in the bore so that the patient's lower extremities may be imaged. In accordance with this aspect of the present invention, the apparatus 300 may be used to image various portions of the lower extremities of a human anatomy, e.g., legs, ankle, knees, with the patient in both a standing and sitting position.

In addition to being configurable to image the lower extremities of a patient, the apparatus 300 may also be configured to image any portion of the human anatomy by allowing the elevator to recess further below the floor 310 into the magnet bore 308. Thus, the apparatus 300 may be used to image the torso of the anatomy. Although the head may also be imaged, in order to avoid creating feelings of anxiety and claustrophobia, it may be preferable to limit imaging in apparatus 300 to below the neck of a patient. Nonetheless, under the appropriate circumstances, the entire body, including the head of a patient, may be imaged using apparatus 300.

It may also be advantageous, from a patient's perspective, to house the apparatus 300 beneath the floor such that it is concealed from the patient. In such an embodiment, auxiliary lighting may be employed to illuminate the magnet's bore space to make the scanning experience more comfortable.

Figure 5:
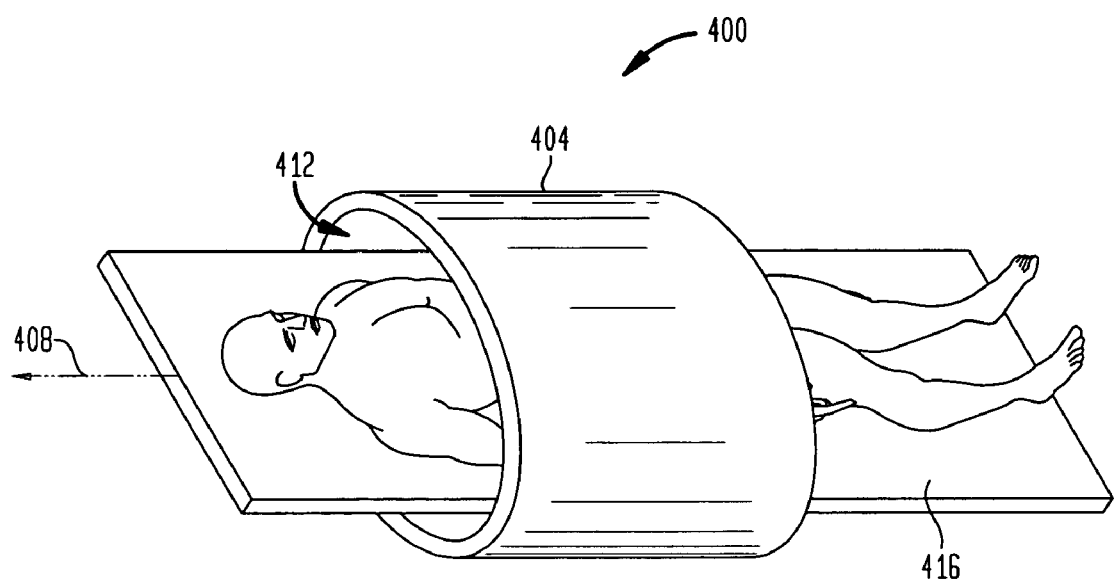
FIG. 5 is a perspective view of a magnetic imaging apparatus in accordance with an aspect of the present invention.

Another aspect of the present invention is a facility for performing magnetic resonance imaging. In accordance with this aspect of the invention, the facility is equipped with a short bore vertical field magnet as described hereinabove and a short bore horizontal field magnet. In accordance with this aspect of the present invention, a short bore horizontal field magnet may be constructed as illustrated in FIG. 5. The apparatus 400 comprises a short bore magnet 404 having a horizontal field axis 408 that extends along a substantially horizontal direction. The magnet 404 includes a bore 412 into which may be placed a patient support 416. The magnet 404 may be of dimensions similar to those discussed hereinabove in relation to FIGS. 1, 2 and 3. Although not shown, the magnet 404 may include various support structures, similar to those disclosed in FIG. 1, to hold the magnet in place. In addition, various arrangements are available for translating the patient support 416 parallel to the horizontal field axis 408. A facility equipped with both horizontal and vertical field short bores may advantageously increase the throughput of the facility.

Figure 6:
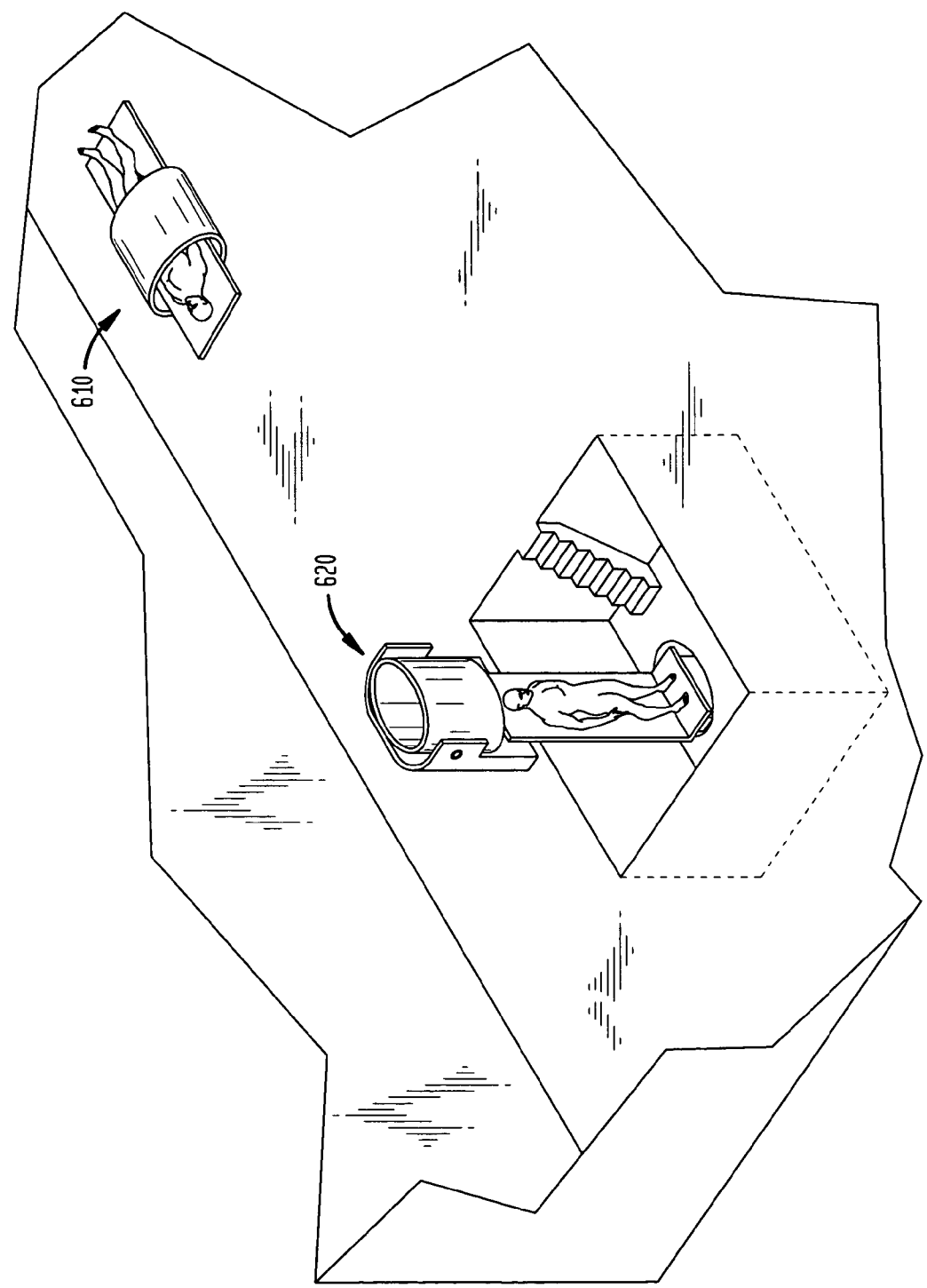
FIG. 6 is an illustrative schematic of a facility in accordance with an aspect of the present invention.

In particular, and as shown in FIG. 6, a facility that includes both a short bore horizontal field magnet 610 and a vertical field magnet 620 may advantageously increase the imaging throughout capability by allowing patients to be imaged in either apparatus. Advantageously, the magnet 620 would be designated for imaging where having the weight bearing position may yield more meaningful information. Alternatively, where it is acceptable that imaging be performed in a horizontal position, magnet 610 may be used. Furthermore, although the magnet 620 is shown as being positioned above the floor as in FIG. 1 or 3, the apparatus of FIG. 4 may comprise the vertical field magnet.

A variant in accordance with the present invention may include a magnet assembly comprising a plurality of coils arranged asymmetrical along an axis such that the center of a static magnetic field generated by the coils is offset from the center of the assembly as described, for example, in U.S. Pat. No. 4,689,591 to McDougall, the disclosure of which is incorporated by references herein in its entirety In accordance with this aspect of the present invention, the coils are oriented to provide a static magnetic field having a field axis oriented in a substantially vertical direction as described above. A patient support device may then be appropriately equipped so as to raise or lower a patient into and out of the static magnetic field for imaging.

A variant in accordance with the present invention may include replacement of either of the magnets 104, 160, 200, 304 or 400 with a pancake magnet of the type disclosed in U.S. Pat. No. 5,428,292 to Dorri et al. ("the '292 patent"), the disclosure of which is incorporated by reference herein in its entirety. Further in accordance with this aspect of the present invention, one or more of the '292 patent magnets may be stacked apart to provide a more open feeling to a patient being imaged. Thus, the magnets may be stacked vertically using assembly posts to provide an open magnetic resonance imaging system. The stacked magnets would then mounted to a support arm or structure and a patient could then be imaged in the bore created by the stacked magnets.

In another variant in accordance with the present invention the magnets 104, 160, 200, 304 or 400 may be replaced with magnet assemblies described in accordance with U.S. Pat. No. 5,291,169 to Ige et al. ("the '169 patent") or U.S. Pat. No. 6,078,234 to Huang, et al. of "the '234 patent"), the disclosure of which is incorporated herein by reference in its entirety. These magnet assemblies desirably comprise a separated pair of annular superconducting magnet assemblies in an open architecture. In accordance with an aspect of the present invention, the magnets of the '169 or '234 patents may be turned on its end to provide a static magnetic field directed substantially in a vertical direction, thereby allowing a standing patient to be imaged within the bore of the magnet assembly.

Although the invention herein has been described with reference to particular embodiments, it is to be understood that these embodiments are merely illustrative of the principles and applications of the present invention. For example, other magnet assemblies such as that described in U.S. Pat. No. 4,721,914 to Fukushima et al., the disclosure of which is incorporated by reference herein in its entirety, may be applied or used in accordance with the present invention. It is therefore to be understood that numerous modifications may be made to the illustrative embodiments and that other arrangements may be devised without departing from the spirit and scope of the present invention as defined by the appended claims.

The invention claimed is:

1. A magnetic resonance imaging apparatus, comprising:
   a magnet having a bore extending along a substantially vertical axis; and
   a patient support device positioned relative to said magnet bore such that said patient support device may be translated in a direction substantially parallel to the vertical axis to occupy said magnet bore, and
   wherein the length of said magnet along a direction parallel to the vertical axis is four feet or less.

2. The apparatus of claim 1 further comprising a building structure housing said magnet and a magnet support structure connected to said building structure and said magnet.

3. The apparatus of claim 2 wherein said building structure includes a floor and said magnet support is connected to said floor.

4. The apparatus of claim 1 further comprising a support structure having one end connected to a ceiling and another end connected to said magnet.

5. The apparatus of claim 1, wherein said magnet has an inner bore diameter of approximately eighteen inches or more.

6. The apparatus of claim 5, wherein said magnet has an inner bore diameter of approximately three feet or more.

7. The apparatus of claim 1, wherein said magnet comprises a solenoidal magnet having turns encircling said bore and adapted to generate a static magnetic field having a field direction coaxial with said bore.

8. The apparatus of claim 1, wherein said patient support device is mounted on an elevator.

9. The apparatus of claim 8, wherein said elevator is disposed in a well in a floor.

10. The apparatus of claim 1 further comprising a support structure having one end connected to a floor and another end connected to said magnet and wherein said patient support device is mounted on an elevator.

11. The apparatus of claim 10, wherein said elevator is disposed in a well in the floor.

12. The apparatus of claim 11, wherein said well is disposed approximately three feet below the level of the floor.

13. The apparatus of claim 12, wherein said magnet includes a first end that is positioned approximately four feet above the floor.

14. The apparatus of claim 1, wherein the length of said magnet along a direction parallel to the vertical axis is less than approximately three feet.

15. The apparatus of claim 1, wherein said magnet and patient support are rotatable between a substantially upright position substantially parallel to said vertical axis and a substantially recumbent position substantially transverse to said vertical axis.

16. The apparatus of claim 15 wherein said magnet and patient support are positionable in a Trendelburg position.

17. The apparatus of claim 15 wherein said magnet and patient support are positionable in a reverse Trendelburg position.

18. A magnetic resonance imaging apparatus, comprising:
a floor;
a magnet having a bore extending along a substantially vertical axis, said magnet being disposed at least partially beneath said floor so that a patient may enter the bore from above.

19. The apparatus of claim 18 further comprising a patient support device positioned relative to said magnet bore such that said patient support device may be translated in a direction substantially parallel to the vertical axis within the magnet bore.

20. The apparatus of claim 18, said patient support device is mounted on an elevator.

21. The apparatus of claim 18, wherein said magnet has an inner bore diameter of approximately three feet.

22. The apparatus of claim 18, wherein said magnet has an inner bore diameter of approximately two feet.

23. The apparatus of claim 18, wherein the length of said magnet along a direction parallel to the vertical axis is less than approximately three feet.

24. The apparatus of claim 18, wherein the length of said magnet along a direction parallel to the vertical axis is less than approximately four feet.

25. A method for performing magnetic resonance imaging, comprising:
providing a magnet having a bore extending three feet or less along a substantially vertical axis;
providing a patient support device positioned relative to said magnet bore such that said patient support device may be translated in a direction substantially parallel to the vertical axis; and positioning a patient on the patient support device such that a portion of the patient's anatomy occupies the space within the magnet bore.

26. The method of claim 25, wherein the patient is positioned in a standing position.

27. The method of claim 26, wherein the patient is positioned in a sitting position.

28. The method of claim 25 further comprising energizing the magnets so as to cause a magnet flux in a direction substantially parallel to the vertical axis.

29. The method of claim 25 further comprising the patient entering the magnet from above the magnet.

30. The method of claim 28 further comprising positioning the patient such that the patient's head remains outside the magnet bore.

31. A method for performing magnetic resonance imaging, comprising:
providing a magnet having a bore extending three feet or less along a substantially vertical axis; and
positioning a patient in a sitting position adjacent the magnet such that the patient's feet hang in the bore.

32. A facility for performing magnetic resonance imaging, comprising:
a first magnet having a bore extending along a substantially vertical axis, said first magnet having a length along a direction parallel to the vertical axis four feet or less; and
a second magnet having a bore extending along a substantially horizontal axis, said second magnet having a length along a direction parallel to the horizontal axis four feet or less.

33. A magnetic resonance imaging apparatus, comprising:
a magnet having a patient-receiving space and a static magnetic field axis in a substantially vertical direction; and
a patient support device positionable in the patient-receiving space such that a long axis of a patient supported by the patient support device is substantially parallel to the direction of the static magnetic field axis.

34. The apparatus of claim 33, wherein said magnet includes a bore extending in a direction substantially parallel to the static magnetic field axis.

35. The apparatus of claim 34, wherein the length of said magnet along the direction of said bore is less than approximately three feet.

36. The apparatus of claim 33, wherein said magnet comprises at least two annular elements.

37. The apparatus of claim 36, wherein said annular elements are connected by spacer members having a long axis parallel to the static magnetic field axis.

38. The apparatus of claim 33, further comprising means for raising or lowering said patient support device into the patient-receiving space.

* * * * *

UNITED STATES PATENT AND TRADEMARK OFFICE
CERTIFICATE OF CORRECTION

PATENT NO. : 7,196,519 B2
APPLICATION NO. : 10/999667
DATED : March 27, 2007
INVENTOR(S) : Raymond V. Damadian It is certified that error appears in the above-identified patent and that said Letters Patent is hereby corrected as shown below:

Column 2, line 62, "aspect the" should read -- aspect of the --.
Column 3, line 48, "also desirable" should read -- also is desirable --.
Column 6, line 15, "the overlaps" should read -- that overlaps --.
Column 8, line 44, "134 is" should read -- 134 are --.
Column 10, line 20, "would then" should read -- would then be --.
Column 10, line 33, "on its end" should read -- on their end --.
Column 11, line 53, "18, said" should read -- 18, wherein said --.

Signed and Sealed this

Fifteenth Day of April, 2008

JON W. DUDAS
*Director of the United States Patent and Trademark Office*